(12) United States Patent
Chan et al.

(10) Patent No.: US 10,318,085 B2
(45) Date of Patent: Jun. 11, 2019

(54) PASSIVE MATRIX ORGANIC LIGHT EMITTING DISPLAY PANELS HAVING TOUCH SENSORS USING ANODE AND CATHODE ELECTRODES

(71) Applicant: Solomon Systech (Shenzhen) Limited, Shenzhen (CN)

(72) Inventors: Wing Chi Stephen Chan, Hong Kong (HK); Wai Hon Ng, Hong Kong (HK); Sing Ng, Hong Kong (HK); Hon Sheung Liu, Hong Kong (HK); Yip Fai Li, Hong Kong (HK); Wai Lan Ng, Hong Kong (HK); Johnkid Lo, Hong Kong (HK)

(73) Assignee: SOLOMON SYSTECH (SHENZHEN) LIMITED, Shenzhen (CN)

( * ) Notice: Subject to any disclaimer, the term of this patent is extended or adjusted under 35 U.S.C. 154(b) by 0 days.

(21) Appl. No.: 15/793,987

(22) Filed: Oct. 26, 2017

(65) Prior Publication Data

US 2019/0018515 A1    Jan. 17, 2019

Related U.S. Application Data

(60) Provisional application No. 62/531,869, filed on Jul. 12, 2017.

(51) Int. Cl.
| | |
|---|---|
| *G06F 3/044* | (2006.01) |
| *H01L 27/32* | (2006.01) |
| *H01L 51/52* | (2006.01) |

(52) U.S. Cl.
CPC ............ *G06F 3/044* (2013.01); *H01L 27/323* (2013.01); *H01L 51/5206* (2013.01); *H01L 51/5221* (2013.01); *G06F 2203/04112* (2013.01)

(58) Field of Classification Search
CPC ...................................................... G06F 3/044
USPC ........................................................ 345/174
See application file for complete search history.

(56) References Cited

U.S. PATENT DOCUMENTS

| | | | |
|---|---|---|---|
| 2013/0106747 A1* | 5/2013 | Choi ..................... | G06F 3/041 345/173 |
| 2017/0123541 A1* | 5/2017 | Omata ................... | G06F 3/044 |
| 2017/0269745 A1* | 9/2017 | Ding ..................... | G06F 3/0412 |

* cited by examiner

*Primary Examiner* — Long D Pham
(74) *Attorney, Agent, or Firm* — Idea Intellectual Limited; Margaret A. Burke; Sam T. Yip

(57) ABSTRACT

A PMOLED touch-sensing display panel using anodes as in-cell touch sensors is provided. The anodes and the cathodes are respectively and correspondingly configured into two or more electrically isolated areas of cathodes and anodes such that the heavy parasitic capacitance due to close proximity of the anode layer and the cathode layer is eliminated, hence providing a full dynamic range in sensing the changes in capacitance due to finger touches.

10 Claims, 14 Drawing Sheets

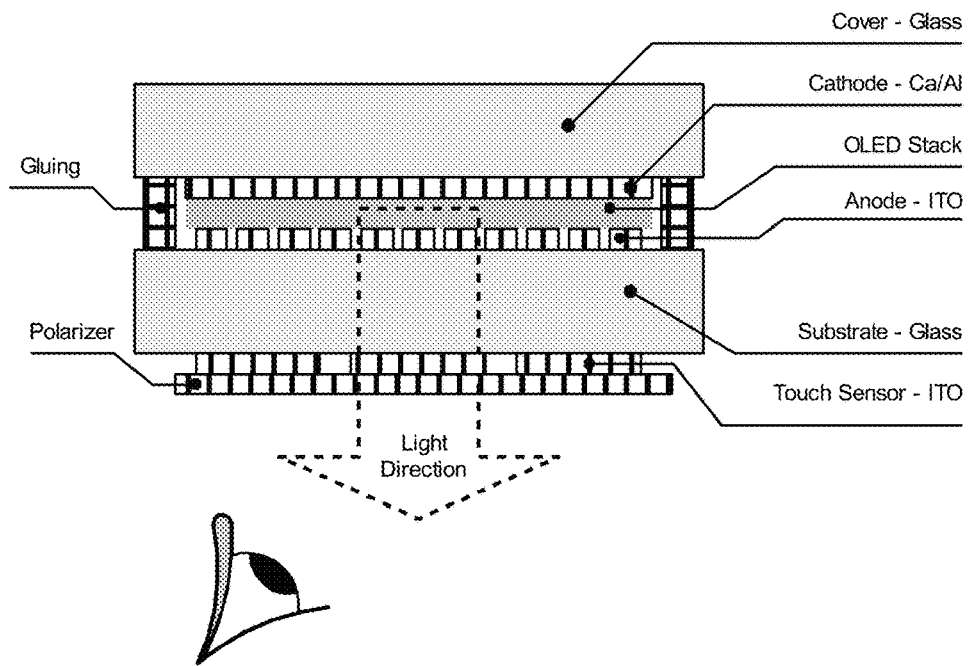
FIG. 1 – Prior Art
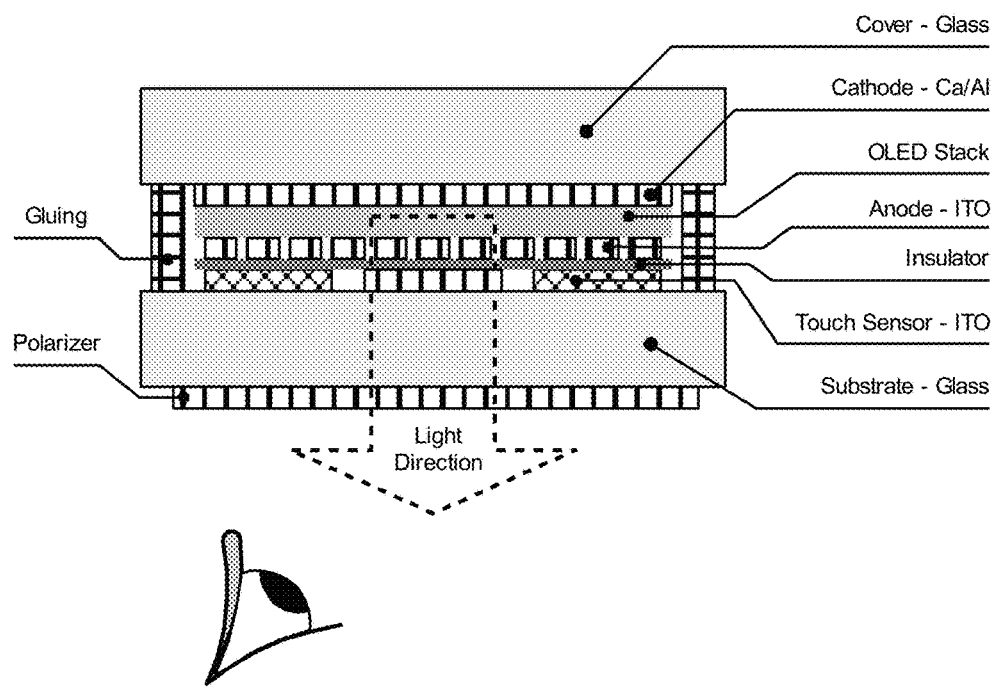
FIG. 2 – Prior Art

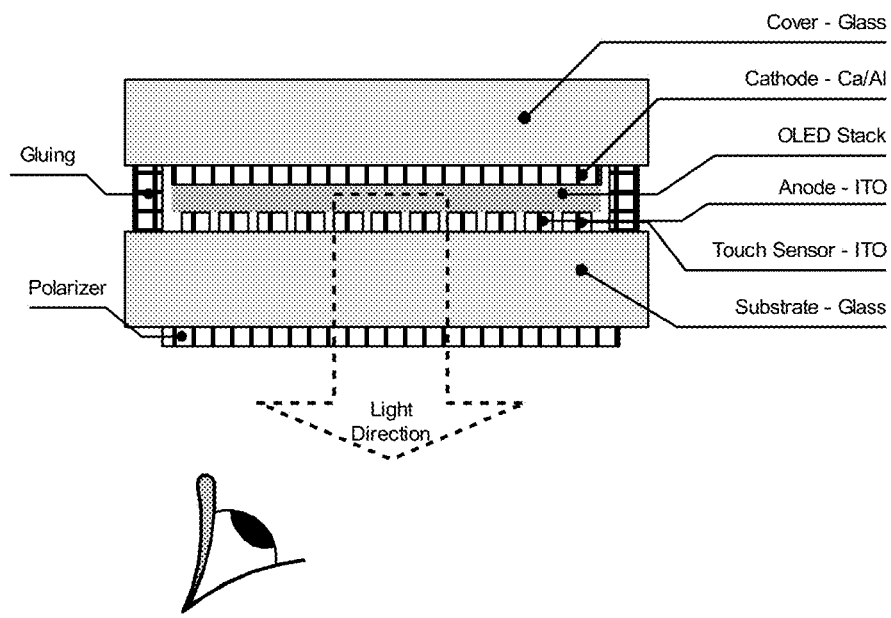
FIG. 3
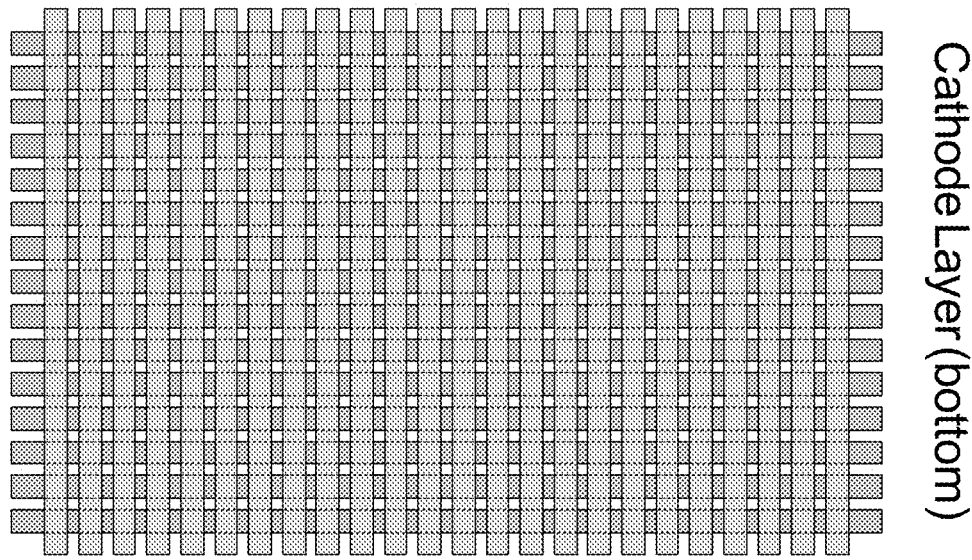
FIG. 4 – Prior Art

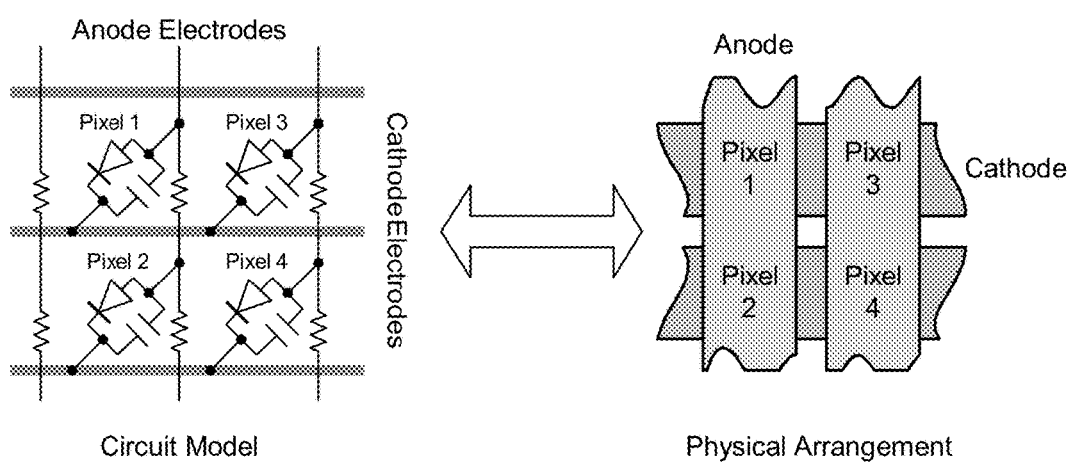
FIG. 5 – Prior Art

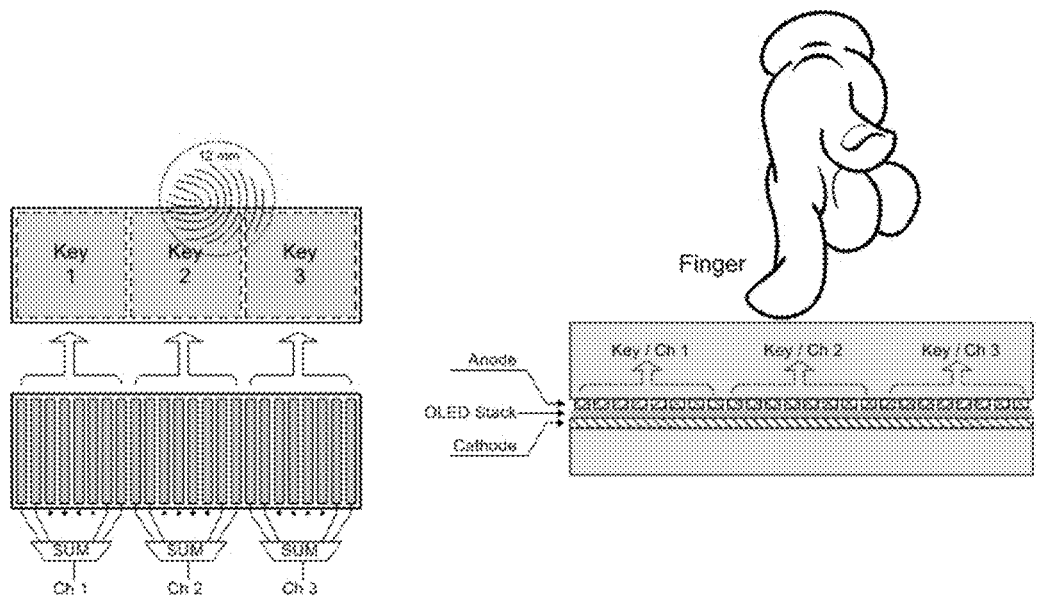
FIG. 6a – Prior Art
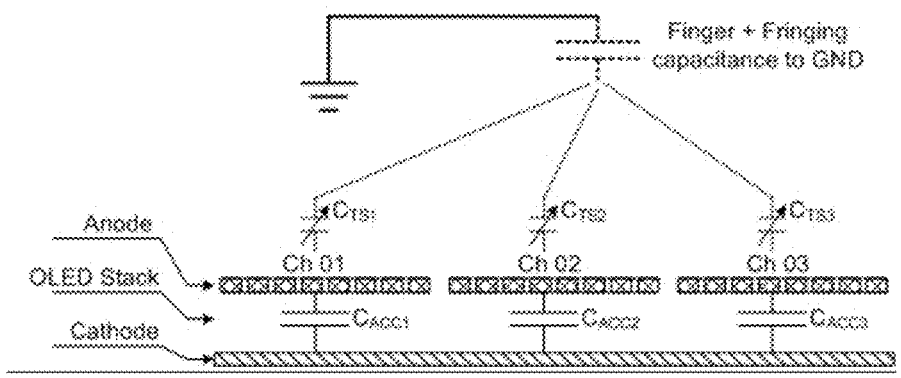
FIG. 6b – Prior Art

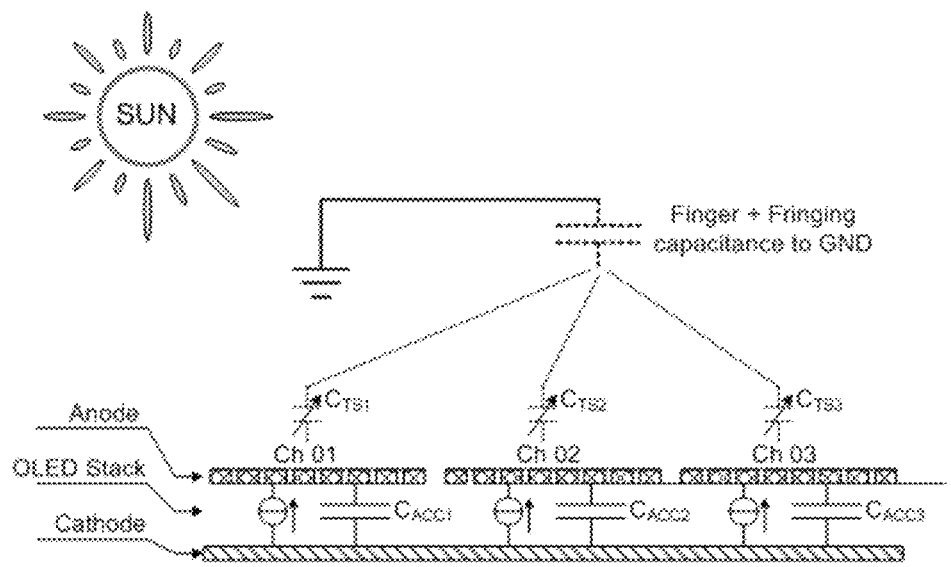
FIG. 7a – Prior Art
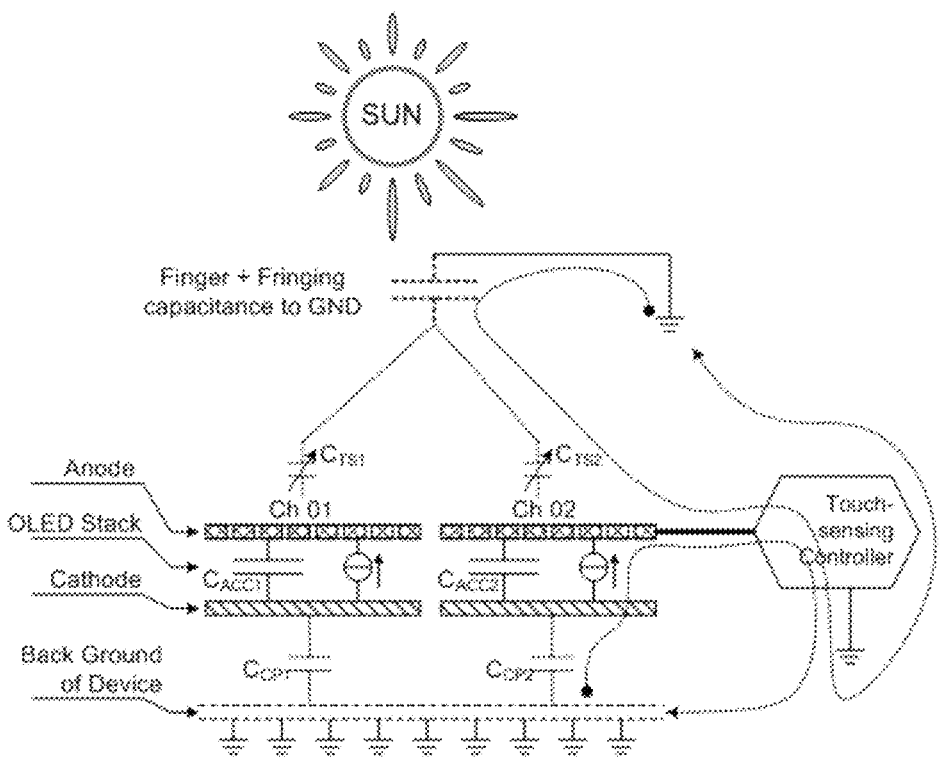
FIG. 7b – Prior Art

PASSIVE MATRIX ORGANIC LIGHT EMITTING DISPLAY PANELS HAVING TOUCH SENSORS USING ANODE AND CATHODE ELECTRODES

CROSS-REFERENCES TO RELATED APPLICATIONS

This application claims priority to U.S. Patent Application No. 62/531,869 filed Jul. 12, 2017; the disclosure of which is incorporated by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention is generally related to self-capacitance type in-cell touch-sensing-enabled display panels. More particularly, this invention is related to using the anodes of a passive matrix organic light emitting diode (PMOLED) display panel as in-cell touch sensors and the arrangement of cathodes and anodes of the PMOLED display panel.

BACKGROUND

The general approach to add touch sensing capability to an organic light emitting diode (OLED) display panel is to supplement a transparent touch sensor layer made from Indium Tin Oxide (ITO) on top of the OLED display panel. To achieve so, there are two possible implementations: 1) Put the transparent touch sensor layer on top of the substrate glass. This is called on-cell touch sensor arrangement; 2) Put the transparent touch sensor layer in-between the cover glass and the substrate glass. This is called in-cell touch sensor arrangement.

The on-cell touch sensor arrangement, as shown in FIG. 1, has the touch sensor layer isolated from the anodes by a thick layer of lower substrate glass (normally, 0.4 mm~0.7 mm). The capacitive coupling between the anodes and the touch sensors is relatively low. This is good for the touch sensors to sense approaching fingers as this allows a relatively large dynamic range in sensing the changes of capacitance caused by finger touches. The display driver is located on the inner side of the substrate glass. This is called Chip on Glass (COG) arrangement which is a commonly used assemble technique. A touch-sensing controller needs to communicate with the display driver and connected to the touch sensors. Hence, a Chip on Film (COF) arrangement is used to bridge the touch sensors to the touch-sensing controller.

On the other hand, the in-cell touch sensor arrangement as shown in FIG. 2 has the touch sensor layer put in-between the upper cover glass and the lower substrate glass. The touch sensor layer is isolated from the anodes by a very thin layer of insulator (0.5 um~1.0 um). Hence, the capacitive coupling between the anodes and the touch sensors is high. This parasitic capacitance is much bigger than the induced capacitance coming from an approaching finger, thus causing a poor dynamic range in sensing the changes of capacitance caused by finger touches. However, display driver and touch-sensing controller integration (putting both functions on the same integrated circuit) is feasible since the integrated circuit (IC), touch sensors, and anodes are all located on the inner side of the lower substrate glass.

A more compact approach of in-cell touch sensor arrangement as shown in FIG. 3 is to merge the touch sensor layer with the anode layer so that the anodes are used for both display-driving and touch-sensing. In this arrangement, the display driving and touch sensing functions are time-multiplexed. That is, within a duty cycle, the panel is either in display driving mode or in touch sensing mode but not both. In a typical application for a PMOLED display with a frame refresh rate of around 100 Hz, the display driving mode may take up 90% of the duty cycle while the touch sensing mode may take up 10% of the duty cycle. However, similar to aforementioned in-cell touch arrangement, the anode layer and the cathode layer are in close proximity as the OLED stack layer is only 1 um thick. Hence, the capacitive coupling between the anode layer and cathode layer is high, resulting in a parasitic capacitance which is much bigger than the induced capacitance coming from an approaching finger.

FIG. 4 shows a layout arrangement for electrodes in a general PMOLED display panel (with the display facing the reader). A lower layer consists of an array of cathodes in strip forms running horizontally. An upper layer consists of an array of anodes in strip forms running vertically. A OLED material layer (not shown in the FIG. 4) is held in-between the anode layer and cathode layer while one side of the OLED material connects to the cathodes and the other side of the OLED material connects to the anodes.

The OLED material being held in-between the anode layer and the cathode layer can be regarded electrically as an array of diodes. FIG. 5 shows a circuit model of a PMOLED. A diode has a p-n junction, which is the interface of p-type material and n-type material. A non-forward biased p-n junction can store electric charge at the depletion region. The p-type and n-type materials function like conducting plates of a capacitor while the depletion region acts like the dielectric material of a capacitor. Hence, a real diode can be represented by an ideal diode plus a capacitor in parallel.

In a PMOLED pixel, the electric field at the depletion region is so strong that it is equivalent to an air gap parallel plate capacitor (i.e. air as dielectric) with air gap 0.25 um thick. As mentioned previously, the substrate glass is 0.4 mm~0.7 mm thick. Another layer of protective glass on a portable electronic device (e.g. smart watch) can be 1 mm~2 mm thick. Hence, an approaching finger can be 2 mm away from the anode layer (the touch sensing layer) while the cathode layer is effectively 0.25 um away from the anode layer only.

FIG. 6a shows a prior application of configuring and grouping anodes for touch sensing in a PMOLED display panel. The anodes are grouped into 3 groups to act as three touch-sensing keys, Key 1, Key 2, and Key 3 (also indicated as Ch1, Ch2, and Ch3 in the diagram). FIG. 6b shows an electrical model of the PMOLED display panel being touched by a finger. The induced touch sensing capacitance coming from an approaching finger on Key # is represented by $C_{TS\#}$, while the capacitive coupling between the anode layer and cathode layer under Key # is represented by $C_{ACC\#}$. As mentioned, the distance between finger and anodes are far (~2 mm) while the distance between anodes and cathodes are close (~0.25 um). The ratio between $C_{ACC\#}$ and $C_{TS\#}$ can be in the order of 8000:1 even if the finger is exactly on top of the touch-sensing key. As shown in FIG.

6b, $C_{TS1}$, $C_{TS2}$ and $C_{TS3}$ are connected through $C_{ACC1}$, $C_{ACC2}$ and $C_{ACC3}$ respectively, it is virtually a short circuit. Therefore, the detection of approaching fingers would be obstructed.

With reference to FIG. 7a, the situation is worsen when the display is exposed to sunlight. Sunlight is a very strong light source. When photons with sufficient energy hit the OLED material, electron-hole pairs are created, which is known as photoelectric effect. The electrons move toward the cathode and the holes travel toward the anode; a photocurrent is produced and hampered the touch-sensing signals. In fact, this photoelectric effect is utilized in photovoltaic solar cells in which sunlight is converted to electricity. The impact to the touch sensing in a OLED display panel by this photoelectric effect is further illustrated in FIG. 7b with the additional current sources representing the photocurrent to the electrical model. There are two current paths passing through the touch-sensing controller; one from an approaching finger and the other from the current source representing the photocurrent. The photocurrent varies as the intensity of sunlight exposure varies. As indicated in FIG. 7b, each cathode forms a parasitic capacitor, $C_{CP\#}$, with the back ground of the device comprising the PMOLED touch-sensing display panel. These parasitic capacitors can be small (in the order of 1 to 5 pF) when the back plate of the PMOLED panel is far away (10 mm for example) from the rest of the electronics in the device. Conversely, these parasitic capacitors can be appreciable (in the order of 10 to 30 pF) when the back plate of the PMOLED touch-sensing display panel is close (less than 2 mm for example in a portable device) to the rest of the electronics in the device. If these parasitic capacitors, $C_{CP\#}$, are small then the photocurrent will be small. On the other hand, if these parasitic capacitors, $C_{CP\#}$, are appreciable, the photocurrent may interfere with the sensing of finger touch current. One way to remove this noise current is to block any possible return path of the photocurrent.

SUMMARY OF THE INVENTION

In accordance with various embodiments of the present invention, a PMOLED touch-sensing display panel using anodes as in-cell touch sensors is provided. The touch sensor layer is merged with the anode layer so that the anodes are used for both display-driving and touch-sensing. In this arrangement, the display driving and touch sensing functions are time-multiplexed. The anodes and the cathodes are configured such that the heavy parasitic capacitance due to close proximity of the anode layer and the cathode layer will not obstruct the sensing of approaching fingers. The PMOLED touch-sensing display panel comprises an anode layer consists of anodes running in parallel to each other, a cathode layer consists of cathodes running in a direction perpendicular to the anodes, a layer of OLED materials being held in between the anode layer and the cathode layer, a display driver and a touch-sensing controller which may be integrated in the display driver.

The cathodes and the anodes are respectively and correspondingly configured into two or more areas of cathodes and anodes. Each of the areas of cathodes is electrically isolated from each other. Each area of anodes serves as a touch-sensing key and signals from each area of anodes are summed by the touch-sensing controller to produce an output-channel signal for touch sensing during a time-multiplexed touch-sensing mode.

In some embodiments, a PMOLED touch-sensing display panel with a one-dimensional touch key design is provided. Each of the cathodes/anodes are split into two or more sub-cathodes/sub-anodes and the sub-cathodes/sub-anodes are grouped into areas of cathodes/anodes configured in a one-dimensional array. The anodes/cathodes are grouped into areas of anodes/cathodes with a configuration that each of the areas of anodes/cathodes is overlapping with one of the areas of cathodes/anodes.

In some embodiments, a PMOLED touch-sensing display panel with a two-dimensional touch key design is provided. Each of the cathodes are split into two or more sub-cathodes and the sub-cathodes are grouped into areas of cathodes configured in a two-dimensional array. Each of the anodes are split into two or more sub-anodes and the sub-anodes are grouped into areas of anodes with a configuration that each of the areas of anodes is overlapping with one of the areas of cathodes.

The PMOLED touch-sensing display panel is operated in display-driving mode or touch-sensing mode in a time multiplexing manner. The cathodes may be connected to high impedance during touch-sensing mode for reducing the noise photocurrent due to sunlight and reconnected to VCOM of the display driver during display-driving mode.

BRIEF DESCRIPTION OF THE DRAWINGS

Embodiments of the invention are described in more detail hereinafter with reference to the drawings, in which:

FIG. 1 depicts an on-cell touch sensor arrangement for a PMOLED display panel;

FIG. 2 depicts an in-cell touch sensor arrangement for a PMOLED display panel;

FIG. 3 depicts an in-cell touch sensor arrangement wherein the touch sensor layer is merged with the anode layer.

FIG. 4 depicts a general PMOLED layout wherein an anode layer atop a cathode layer;

FIG. 5 depicts a circuit model of a general PMOLED;

FIG. 6a depicts a prior application of configuring and grouping anodes for touch sensing in a PMOLED display panel; FIG. 6b depicts an electrical model of the PMOLED display panel being touched by a finger;

FIG. 7a depicts an electrical model of a touch panel in a situation where a noise current is generated by sunlight due to photoelectric effect; FIG. 7b depicts another electrical model of a touch panel to further illustrate the situation where the noise current is generated by sunlight due to photoelectric effect;

DETAILED DESCRIPTION OF THE INVENTION

In the following description, PMOLED touch-sensing display panels using anodes as in-cell touch sensors and the like are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 8A:
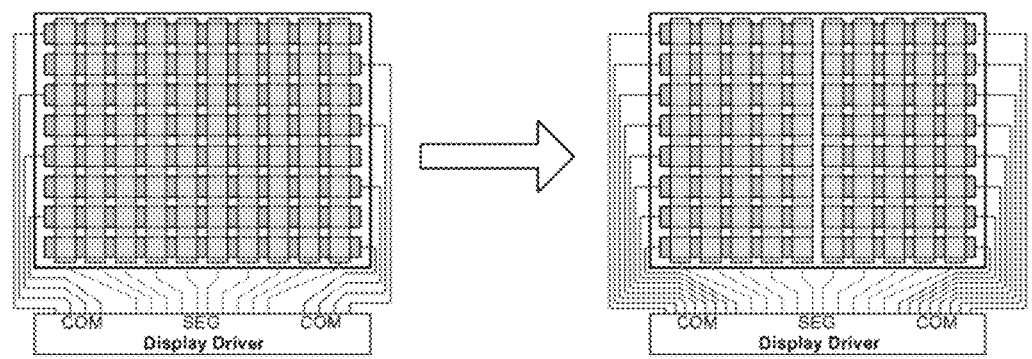
FIG. 8a depicts a PMOLED touch-sensing display panel with a one-dimensional touch key design in accordance to an embodiment of the present invention.

FIG. 8a shows an embodiment of a PMOLED touch-sensing display panel with a one-dimensional touch key design. In this embodiment, the cathode layer comprises a plurality of cathodes running horizontally and the anode layer comprises a plurality of anodes running vertically in respect to the default display orientation of the display panel. Each of the cathodes are split (or cut) into two or more sub-cathodes and the sub-cathodes are grouped into areas of cathodes configured in a one-dimensional array. The anodes are grouped into areas of anodes with a configuration that each of the areas of anodes is overlapping with one of the areas of cathodes. Each of the areas of cathodes is electrically isolated from each other.

The sub-cathodes and anodes are connected to the display driver separately. The cathodes are also called common (COM) electrodes as they carry the aggregated current from all anodes per line scan in display-driving mode. The anodes are also called segment (SEG) electrodes as each of them only modulate a small segment of the display panel in display-driving mode. Accordingly, the sub-cathodes and anodes are connected to the display driver in a configuration with a 'COM' group on the left, a 'SEG' group in the middle and a 'COM' group on the right, which is so called a 'COM-SEG-COM' arrangement.

Figure 8B:
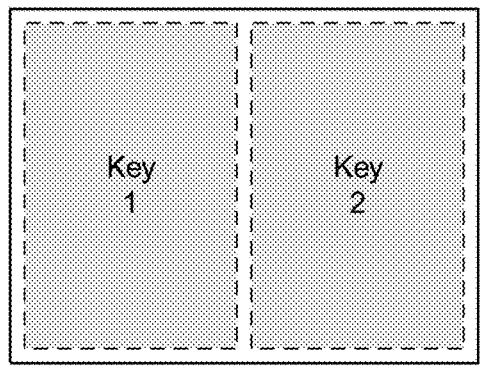
FIG. 8b shows a functionally comparable one-dimensional touch key design with two touch-sensing keys.
Figure 8C:
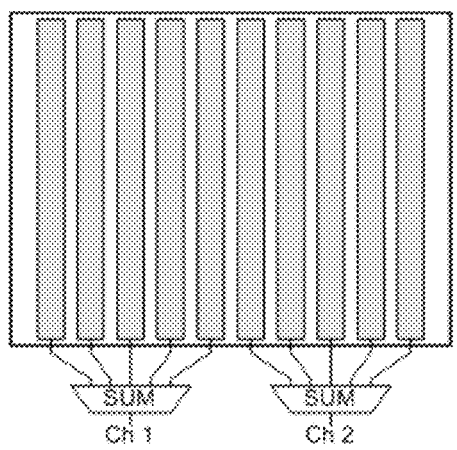
FIG. 8c shows the touch-sensing mechanism.

FIG. 8b shows a functionally comparable one-dimensional touch key design with two touch-sensing keys, Key 1 and Key 2, corresponding to the two areas of anodes and cathodes. Referring to FIG. 8c, during touch-sensing mode, each area of anodes acts as a touch-sensing key and signals from each area of anodes are summed by the touch-sensing controller to produce an output-channel signal for touch sensing, Ch1 and Ch2 for Key 1 and Key 2 respectively.

Figure 9:
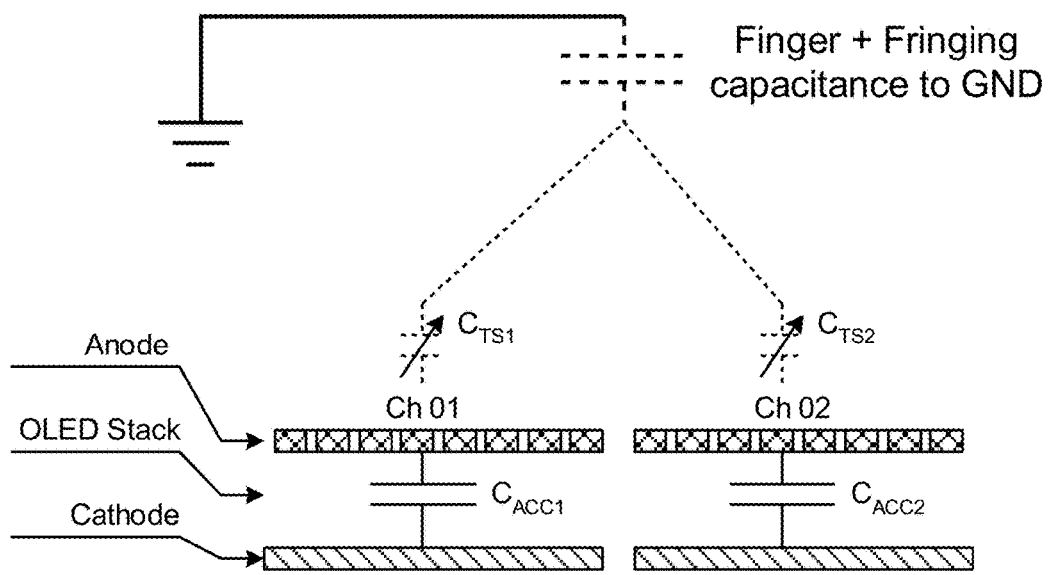
FIG. 9 depicts the electrical model of a one-dimensional two-key touch panel during touch-sensing mode in accordance to an embodiment of the present invention.

FIG. 9 shows an electrical model of the one-dimensional two-key touch panel during touch-sensing mode. The capacitive coupling between the divided areas on the anode layer and cathode layer, $C_{ACC1}$ and $C_{ACC2}$, corresponding to Key 1 and Key 2, are now disconnected. Hence, by putting all cathodes into high impedance (Hi-Z), the parasitic capacitor $C_{ACC1}$ and $C_{ACC2}$ are eliminated and the detection of induced touch sensing capacitance, $C_{TS1}$ and $C_{TS2}$ coming from an approaching finger on Key 1 and Key 2, becomes robust with a full dynamic range in sensing the capacitance changes.

Figure 10A:
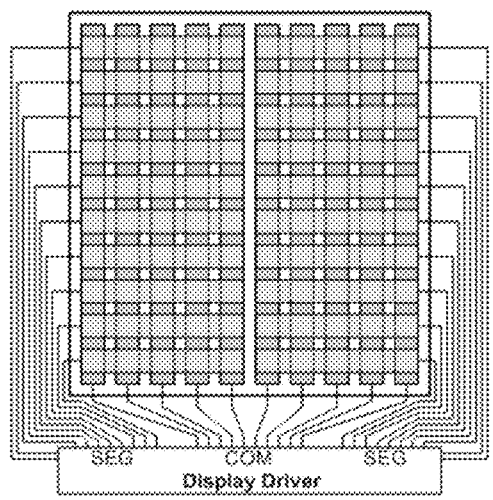
FIG. 10a depicts a PMOLED touch-sensing display panel with a one-dimensional touch key design in accordance to another embodiment of the present invention.

FIG. 10a shows another embodiment of a PMOLED touch-sensing display panel with a one-dimensional touch key design. In this embodiment, the cathode layer comprises a plurality of cathodes running vertically and the anode layer comprises a plurality of anodes running horizontally in respect to the default display orientation of the display panel. Each of the anodes are split into two or more sub-anodes and the sub-anodes are grouped into areas of anodes configured in a one-dimensional array. The cathodes are grouped into areas of cathodes with a configuration that each of the areas of cathodes is overlapping with one of the areas of anodes. Each of the areas of cathodes is electrically isolated from each other.

The cathodes and sub-anodes are connected to the display driver separately. In this embodiment, the cathodes and sub-anodes are connected to the display driver in a configuration with a 'SEG' group on the left, a 'COM' group in the middle and a 'SEG' group on the right, which is so called a SEG-COM-SEG arrangement.

Figure 10B:
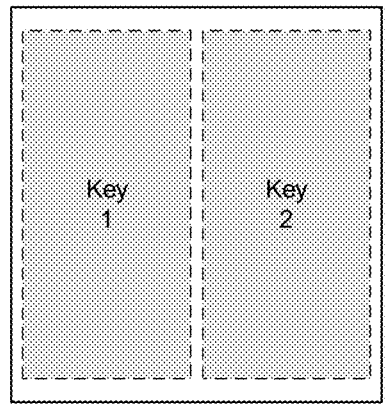
FIG. 10b shows a functionally comparable one-dimensional touch key design with two touch-sensing keys.
Figure 10C:
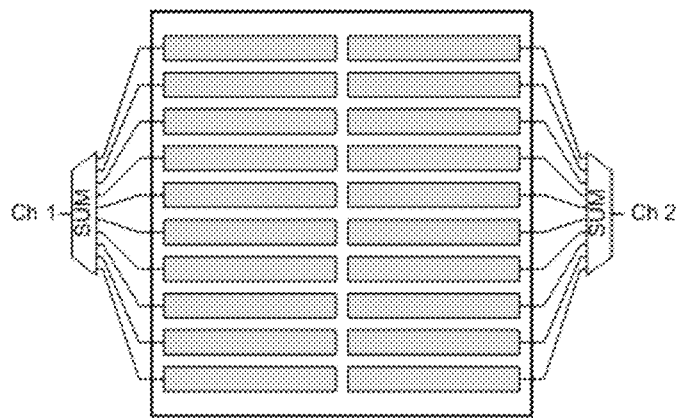
FIG. 10c shows the touch-sensing mechanism.

FIG. 10b shows a functionally comparable one-dimensional touch key design with two touch-sensing keys, Key 1 and Key 2, corresponding to the areas of anodes and cathodes in FIG. 10a. Referring to FIG. 10c, during touch-sensing mode, each area of anodes acts as a touch-sensing key and signals from each area of anodes are summed by the touch-sensing controller to produce an output-channel signal for touch sensing, Ch1 and Ch2 for Key 1 and Key 2 respectively.

Figure 11A:
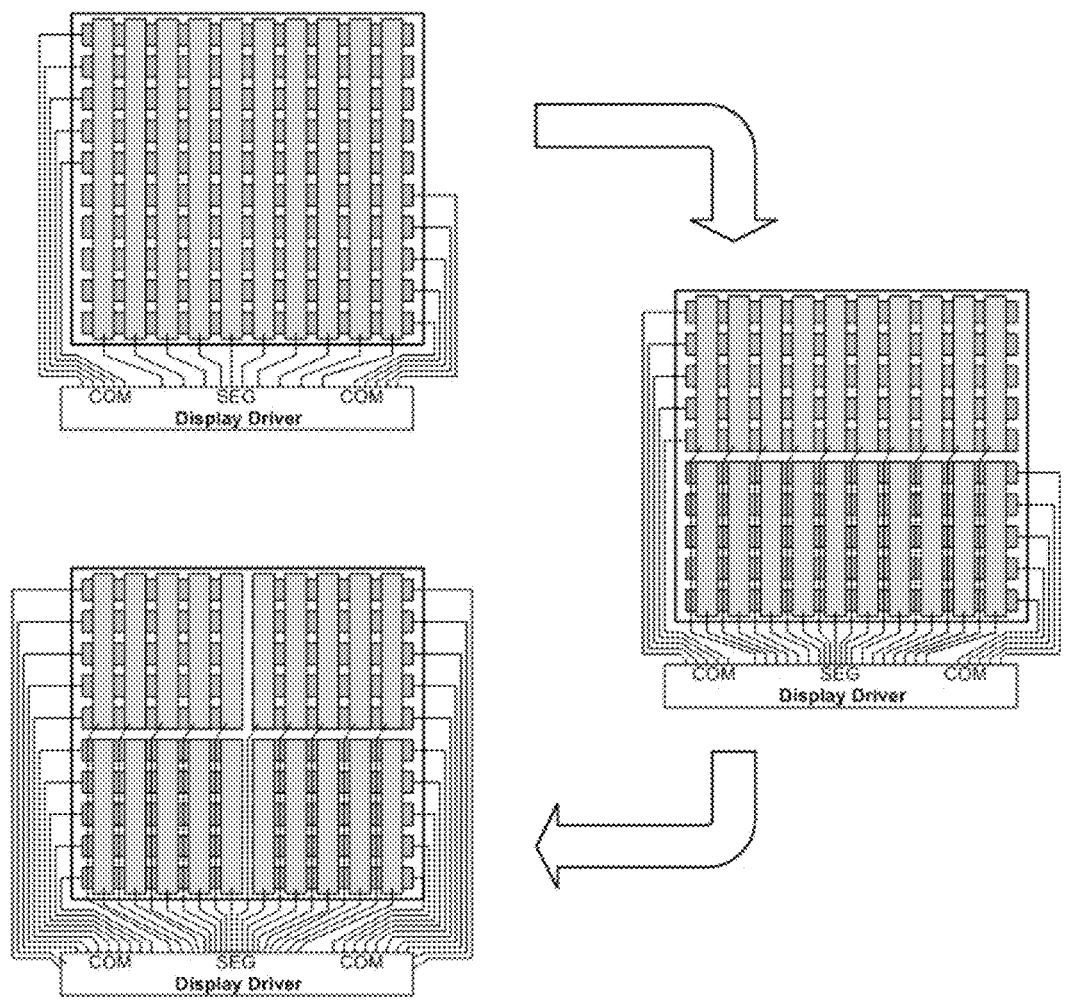
FIG. 11a depicts a PMOLED touch-sensing display panel with a two-dimensional touch key design in accordance to an embodiment of the present invention.

FIG. 11a shows an embodiment for a PMOLED touch-sensing display panel with a two-dimensional touch key design. In this embodiment, the cathode layer comprises a plurality of cathodes running horizontally and the anode layer comprises a plurality of anodes running vertically in respect to the default display orientation of the display panel. Each of the cathodes are split into two or more sub-cathodes and each of the anodes are split into two or more sub-anodes. The sub-cathodes and the sub-anodes are respectively and correspondingly grouped into four areas of cathodes and anodes configured in a two-by-two array. Each of the areas of cathodes is isolated from each other.

The sub-cathodes and sub-anodes are connected to the display driver separately. In this embodiment, the sub-cathodes and sub-anodes are connected to the display driver in a configuration with a 'COM' group on the left, a 'SEG' group in the middle and a 'COM' group on the right, which is so called a 'COM-SEG-COM' arrangement.

Figure 11B:
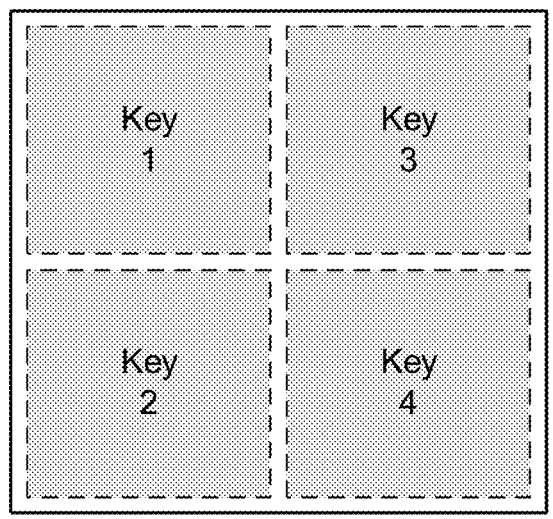
FIG. 11b shows a functionally comparable two-dimensional touch key design with four touch-sensing keys.
Figure 11C:
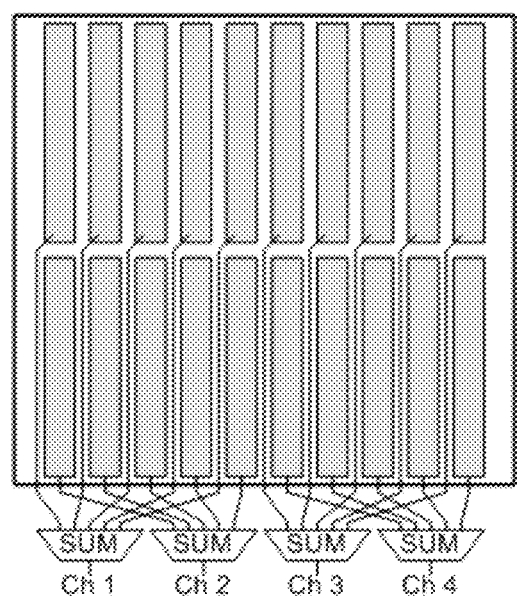
FIG. 11c shows the touch-sensing mechanism.

FIG. 11b shows a functionally comparable two-dimensional touch key design with four touch-sensing keys, Key 1, Key 2, Key 3, and Key 4, corresponding to the four areas of anodes and cathodes in FIG. 11a. Referring to FIG. 11c, during touch-sensing mode, each area of anodes serves as a touch-sensing key and signals from each area of anodes are summed by the touch-sensing controller to produce an output-channel signal for touch sensing, Ch1 to Ch4 for Keys 1 to 4 respectively. By doing so, a two-dimensional touch panel can be formed to effectively detect touching gestures in up/down and left/right directions.

Figure 12A:
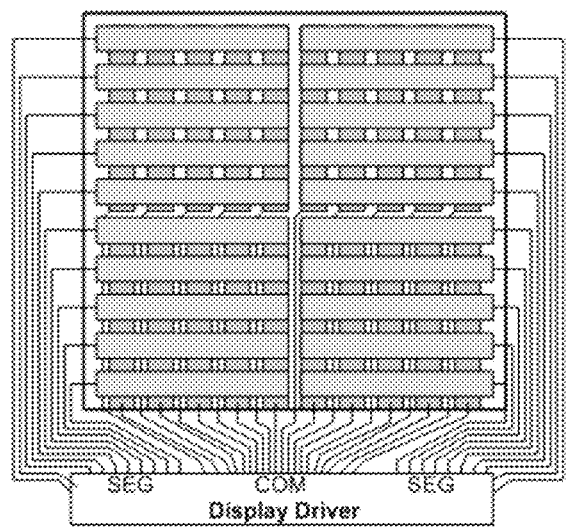
FIG. 12a depicts a PMOLED touch-sensing display panel with a two-dimensional touch key design in accordance to another embodiment of the present invention.

FIG. 12a shows another embodiment for a PMOLED touch-sensing display panel with a two-dimensional touch key design. In this embodiment, the cathode layer comprises a plurality of cathodes running vertically and the anode layer comprises of plurality of anodes running horizontally in respect to the default display orientation of the display panel. Each of the cathodes are split into two or more sub-cathodes and each of the anodes are split into two or more sub-anodes. The sub-cathodes and the sub-anodes are respectively and correspondingly grouped into four areas of cathodes and anodes configured in a two-by-two array. Each of the areas of cathodes is electrically isolated from each other.

The sub-anodes and sub-cathodes are connected to the display driver separately. Accordingly, the sub-anodes and sub-cathodes are connected to the display driver in a configuration with a 'SEG' group on the left, a 'COM' group in the middle and a 'SEG' group on the right, which is so called a 'SEG-COM-SEG' arrangement.

Figure 12B:
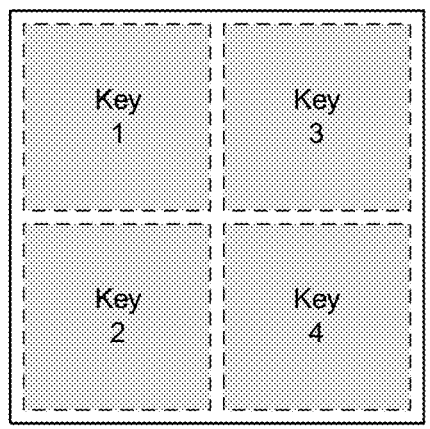
FIG. 12b shows a functionally comparable two-dimensional touch key design with four touch-sensing keys.
Figure 12C:
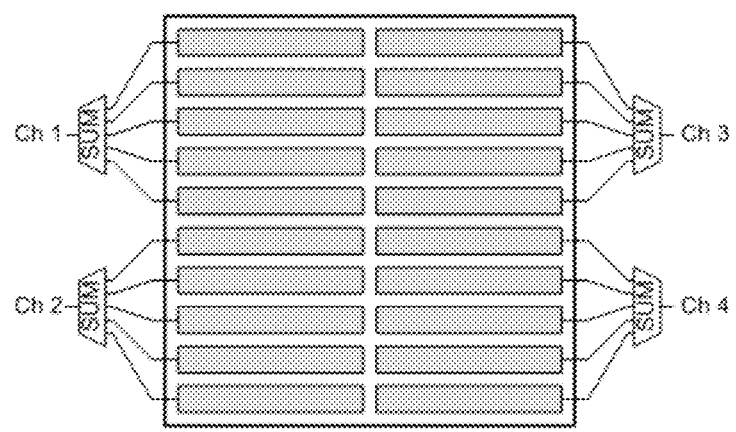
FIG. 12c shows the touch-sensing mechanism.

FIG. 12b shows a functionally comparable two-dimensional touch key design with four touch-sensing keys, Key 1, Key 2, Key 3, and Key 4, corresponding to the four areas of anodes and cathodes in FIG. 12a. Referring to FIG. 12c, during touch-sensing mode, each area of anodes serves as a touch-sensing key and signals from each area of anodes are summed by the touch-sensing controller to produce an output-channel signal for touch sensing, Ch1 to Ch4 for Keys 1 to 4 respectively. By doing so, a two-dimensional touch panel can be formed to effectively detect touching gestures in up/down and left/right directions.

In some embodiments of the present invention, preferably, the PMOLED touch-sensing display panel are operated in display-driving mode or touch-sensing mode are operated in a time-multiplexing manner. That is, in a duty cycle, the panel is either in display driving mode or in touch sensing mode but not both. In a particular embodiment where the PMOLED touch-sensing display panel is with a frame refresh rate of around 100 Hz, the display-driving mode takes up 90% of the duty cycle while the touch sensing mode takes up 10% of the duty cycle.

Figure 13A:
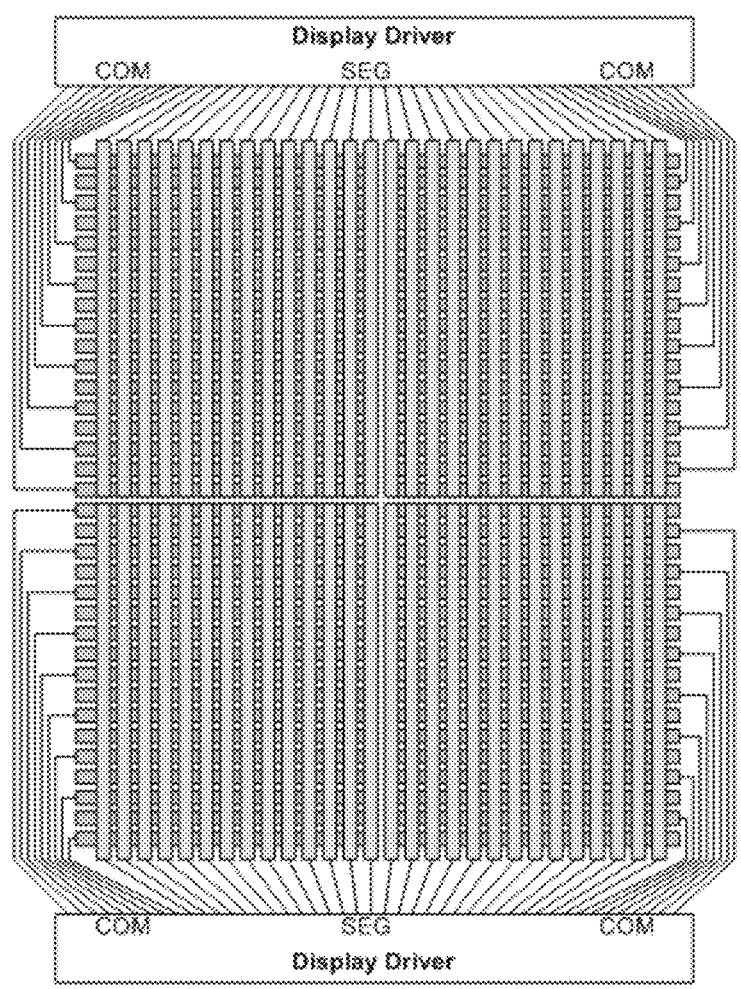
FIG. 13a depicts a PMOLED touch-sensing display panel with a two-dimensional touch key design with two display drivers in accordance to another embodiment of the present invention.

FIG. 13a shows yet another embodiment for a PMOLED touch-sensing display panel with a two-dimensional touch key design. The configuration of anodes and cathodes is similar to the embodiment shown in FIG. 11a but the size of the panel is larger and number of electrodes are greater. In this case, it can be beneficial to drive the panel with two display drivers. One display driver located at the top and the other located at the bottom, driving the electrodes located in the upper part and the lower parts respectively. As the anodes are make from Indium Tin Oxide (ITO) that is conductive but resistive also and high voltage is needed to drive through long wire of ITO. This arrangement can help saving power as the wires connecting the driver display and the anodes can be shorten. This arrangement can also increase frame refresh rate since two cathodes (or two lines) are addressed at any single time instance.

Figure 13B:
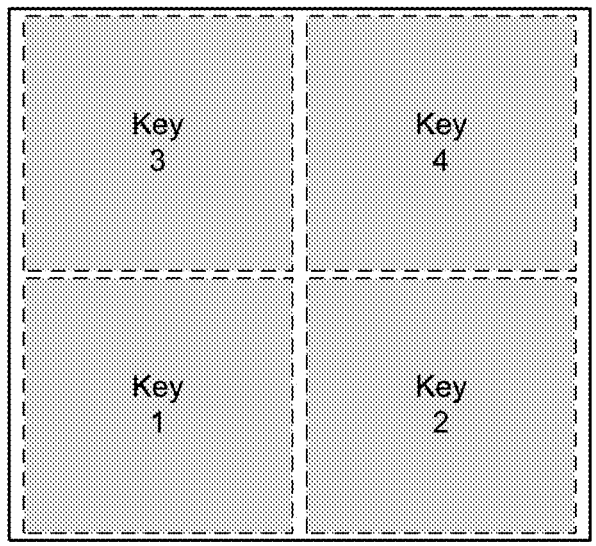
FIG. 13b shows a functionally comparable two-dimensional touch key design with four touch-sensing keys.
Figure 13C:
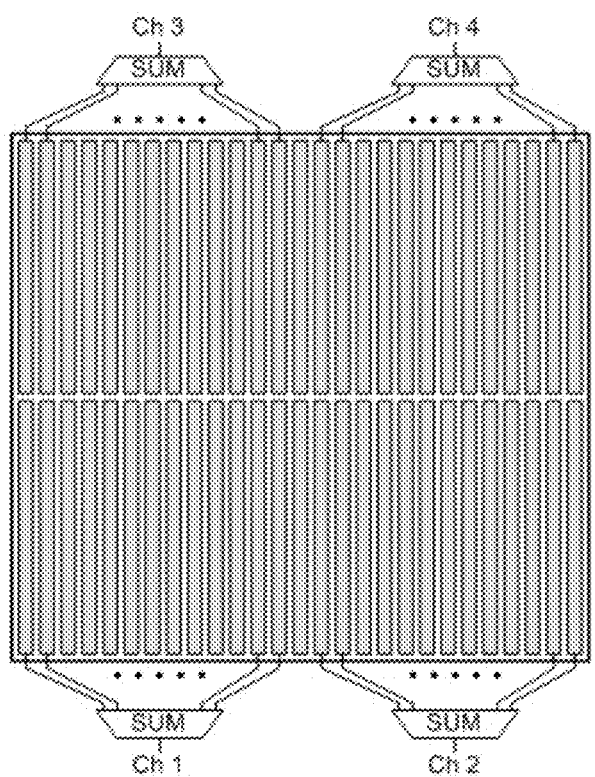
FIG. 13c shows the touch-sensing mechanism.

FIG. 13b shows a functionally comparable two-dimensional touch key design with four touch-sensing keys, Keys 1 to 4, corresponding to the four areas of anodes and cathodes in FIG. 13a. Referring to FIG. 13c. During touch-sensing mode, each area of anodes acts as a touch-sensing key and signals from each area of anodes are summed by the touch-sensing controller to produce an output-channel signal for touch-sensing signals, Ch1 to Ch4 for Keys 1 to 4 respectively. By doing so, a two-dimensional touch panel can be formed to effectively detect touching gestures in up/down and left/right directions.

As can be seen in above embodiments, the number of routing coming out from the display driver is more as the number of areas of anodes and cathodes increases. This is a shortcoming but nonetheless has a positive effect on the frame refresh rate. In a classic passive matrix arrangement, only one horizontal line is select for display driving at any single time instance. In the present invention, two horizontal lines can be selected at any single time instance. Hence, the frame refresh rate can be double. In another proposition, the present embodiment can support a higher resolution PMOLED display at the same frame refresh rate.

In some embodiments of the present invention, preferably, the sub-cathodes of the PMOLED touch-sensing display panel are connected to high impedance (Hi-Z) during touch-sensing mode to cut any possible return path of the photo-current generated by the sunlight so as to remove this noise current, and re-connected to VCOM during display-driving mode.

Figure 14:
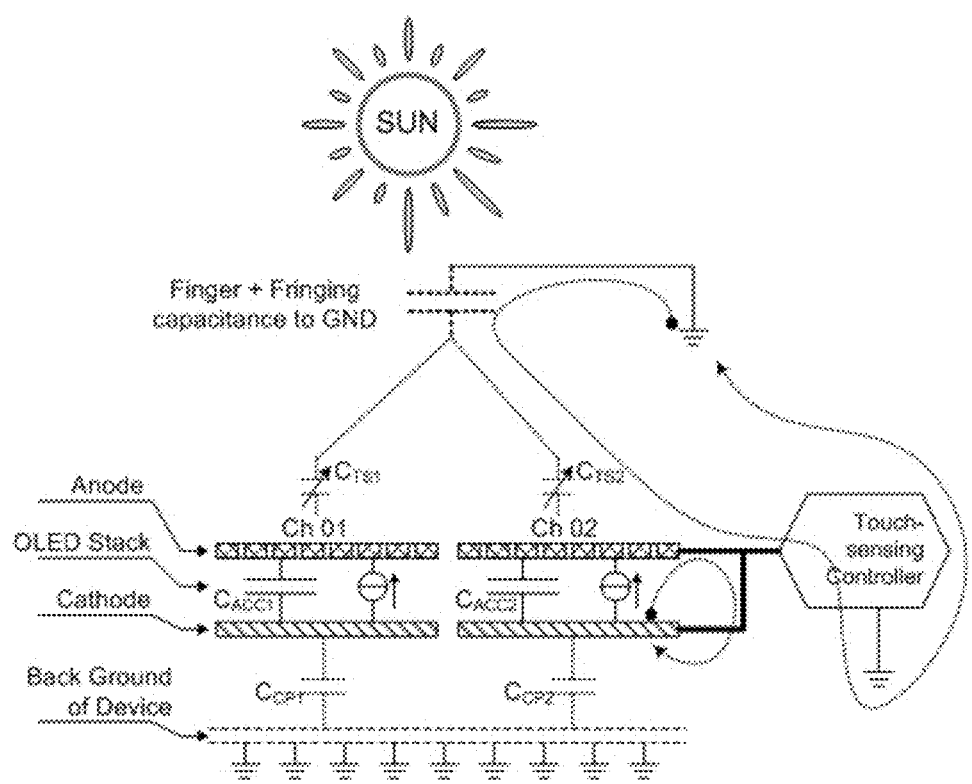
FIG. 14 depicts a PMOLED touch-sensing display panel wherein the sub-anodes and the sub-cathodes are shorted under the same overlaying area with the micro-switches.

In some other embodiments of the present invention, preferably, the touch-sensing controller comprises a plurality of micro-switches. The sub-anodes and the sub-cathodes are shorted under the same overlaying area with the micro-switches during touch-sensing mode as shown in FIG. 14 such that the photocurrents generated by the sunlight loop back to the current sources directly without passing through the touch-sensing controller.

Although the foregoing description have provided only embodiments of two touch-sensing key one-dimensional arrays and two-by-two touch-sensing key two-dimensional arrays, different configurations, such as four touch-sensing key one-dimensional arrays and four-by-four touch-sensing key two-dimensional arrays are possible by adapting the embodiments described above without departing from the spirit of the present invention. Although the present invention is particularly useful in PMOLED touch display panels in which OLED pixels are used, the application of the present invention is not limited only to PMOLED touch display panels. The present invention is applicable to any LED-based touch display panel realized by any electroluminescent material, organic or inorganic. Furthermore, in the foregoing description for illustrating the present invention, although anode electrodes in OLED pixels are used as touch sensors. Those skilled in the art will appreciate that cathode electrodes can also be used as touch sensors without departing from the spirit of the present invention. The present invention is applicable regardless of whether anode electrodes or cathode electrodes are chosen as the touch sensors.

The embodiments disclosed herein may be implemented using a general purpose or specialized computing device, computer processor, or electronic circuitry including but not limited to a digital signal processor (DSP), application specific integrated circuit (ASIC), a field programmable gate array (FPGA), and other programmable logic device configured or programmed according to the teachings of the present disclosure. Computer instructions or software codes running in the general purpose or specialized computing device, computer processor, or programmable logic device can readily be prepared by practitioners skilled in the software or electronic art based on the teachings of the present disclosure.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A touch-sensing display panel, comprising:
a first electrode layer consists of a plurality of first electrodes running in parallel to each other;
an second electrode layer consists of a plurality of second electrodes running in a direction perpendicular to the first electrodes;
a layer of electroluminescent materials being held in between the first electrode layer and the second electrode layer; and
at least one touch-sensing controller;
wherein each of the first electrodes is split into two or more first sub-electrodes forming two or more areas of first sub-electrodes; and
wherein each of the second electrodes are grouped to form two or more areas of second electrodes; and
wherein each overlapping area of each of the areas of first sub-electrodes and each of the areas of second electrodes serves as a touch-sensing key with signals from the second electrodes in each of the area of second electrodes are summed by the touch-sensing controller to produce an output-channel signal for touch sensing during a time-multiplexed touch-sensing mode.

2. The touch-sensing display panel of claim 1,
wherein each of the second electrodes is split into two or more second sub-electrodes forming two or more areas of second sub-electrodes; and
wherein each overlapping area of each of the areas of first sub-electrodes and each of the areas of second sub-electrodes serves as a touch-sensing key with signals from the second sub-electrodes in each of the area of second sub-electrodes are summed by the touch-sensing controller to produce an output-channel signal for touch sensing during the time-multiplexed touch-sensing mode.

3. The touch-sensing display panel of claim 2,
wherein the first electrodes are running in the horizontal direction of the touch-sensing display panel; and
wherein more than one first electrode are driven at any one instance during a time-multiplexed display-driving mode.

4. The touch-sensing display panel of claim 2,
wherein the first electrodes are running in the vertical direction of the touch-sensing display panel; and
wherein more than one first electrode are driven at any one instance during a time-multiplexed display-driving mode.

5. The touch-sensing display panel of claim 2,
wherein the first electrodes are cathodes, the first sub-electrodes are sub-cathodes, the second electrodes are anodes, and the second sub-electrodes are sub-anodes;
wherein the overlapping areas of the areas of first sub-electrodes and the areas of second sub-electrodes are configured in a two-dimensional touch-sensing key array.

6. The touch-sensing display panel of claim 2, further comprising:
a first display driver located at a first side of the touch-sensing display panel; and
a second display driver located at a second side of the touch-sensing display panel, wherein the second side is opposite of the first side;
wherein the first sub-electrodes and the second sub-electrodes that are closer to the first side of the touch-sensing display panel than to the second side of the touch-sensing display panel are connected to the first display driver and driven by the first display driver during a time-multiplexed display-driving mode; and
wherein the first sub-electrodes and the second sub-electrodes that are closer to the second side of the touch-sensing display panel than to the first side of the touch-sensing display panel are connected to the second display driver and driven by the second display driver during a time-multiplexed display-driving mode.

7. The touch-sensing display panel of claim 2,
wherein the first sub-electrodes are connected to high impedance during the time-multiplexed touch-sensing mode.

8. The touch-sensing display panel of claim 2,
wherein the touch-sensing controller comprises a plurality of micro-switches; and
the first sub-electrodes and second sub-electrodes are shorted by the micro-switches during the time-multiplexed touch-sensing mode.

9. The touch-sensing display panel of claim 1, wherein during the time-multiplexed touch-sensing mode, each of the first sub-electrodes are connected to a high impedance and each group of first sub-electrodes split from the same first electrode is configured to eliminate a parasitic capacitance between each crossing of the first sub-electrodes and second electrodes.

10. The touch-sensing display panel of claim 1,
wherein the first electrodes are cathodes, the first sub-electrodes are sub-cathodes, and the second electrodes are anodes;
wherein the areas of first sub-electrodes are configured in a one-dimensional touch-sensing key array.

* * * * *